United States Patent
Kawaura et al.

(10) Patent No.: US 8,421,049 B2
(45) Date of Patent: Apr. 16, 2013

(54) METAL ATOM MIGRATION SWITCHING DEVICE, DRIVE AND MANUFACTURING METHODS FOR THE SAME, INTEGRATED CIRCUIT DEVICE AND MEMORY DEVICE USING SAME

(75) Inventors: Hisao Kawaura, Minato-ku (JP); Hiroshi Sunamura, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/173,792

(22) Filed: Jun. 30, 2011

(65) Prior Publication Data

US 2011/0253967 A1    Oct. 20, 2011

Related U.S. Application Data

(62) Division of application No. 11/722,825, filed as application No. PCT/JP2005/023656 on Dec. 22, 2005, now Pat. No. 8,003,969.

(30) Foreign Application Priority Data

Dec. 27, 2004    (JP) ................. 2004-376767

(51) Int. Cl.
*H01L 29/02* (2006.01)
*H01L 29/06* (2006.01)

(52) U.S. Cl.
USPC .................................. 257/2; 257/8

(58) Field of Classification Search .......... 257/2–5, 257/8, E31.001, E31.027, E31.028, E31.029
See application file for complete search history.

(56) References Cited

U.S. PATENT DOCUMENTS 5,761,115 A * 6/1998 Kozicki et al. ............ 365/182
2006/0102927 A1    5/2006 Fujita et al.

FOREIGN PATENT DOCUMENTS

| JP | 2001-525606 A | 12/2001 |
| JP | 2002-076325 A | 3/2002 |
| JP | 2002-536840 A | 10/2002 |
| JP | 2003-092387 A | 3/2003 |
| WO | 03-028124 A1 | 4/2003 |
| WO | 03/094227 A1 | 11/2003 |

OTHER PUBLICATIONS

T. Sakamoto et al., "A nonvolatile programmable solid electrolyte nanometer switch", Solid-State Circuits Conference, 2004. Digest of Technical Papers. ISSCC. 2004 IEEE International, 2004, pp. 290-291.
T. Sakamoto et al., "Nanometer-scale switches copper Sulfide", Applied Physics Letters, 2003, pp. 3032 to 3034, vol. 82, No. 18.
Office Action, issued Apr. 3, 2012 by the Japanese Patent Office in counterpart Japanese Application No. 2006-550731.

* cited by examiner

*Primary Examiner* — Hung Vu
(74) *Attorney, Agent, or Firm* — Sughrue Mion, PLLC

(57) ABSTRACT

Provided is a switching device including ion conducting part 4 having an ion conductor, first electrode 1 formed at a first gap away from ion conducting part 4, second electrode 2 formed to be in contact with ion conducting part 4 and third electrode 3 formed at a second gap away from ion conducting part 4. Second electrode 2 supplies metal ions to the ion conductor, or receives the metal ions from the ion conductor to precipitate metal corresponding to the metal ions.

8 Claims, 10 Drawing Sheets

(f)

(g)

(h)

(i)

METAL ATOM MIGRATION SWITCHING DEVICE, DRIVE AND MANUFACTURING METHODS FOR THE SAME, INTEGRATED CIRCUIT DEVICE AND MEMORY DEVICE USING SAME

CROSS REFERENCE TO RELATED APPLICATIONS

This application is a divisional of U.S. patent application Ser. No. 11/722,825, filed Jun. 26, 2007, which is a national stage of International Application No. PCT/JP2005/023656, filed Dec. 22, 2005, claiming priority based on Japanese Patent Application No. 2004-376767, filed Dec. 27, 2004, the contents of all of which are incorporated herein by reference in their entirety.

TECHNICAL FIELD

The present invention relates to a switching device used in an integrated circuit, drive and manufacturing methods for the same, an integrated circuit device and a memory device.

BACKGROUND ART

Many integrated circuit devices are now used in electrical appliances. Many integrated circuit devices used in the electrical appliances are so-called "ASIC (Application Specific Integrated Circuit)" and dedicated circuits designed for particular electrical appliances. In these ASICs, because a cell (logic circuit such as an AND circuit and an OR circuit) is arranged and interconnected in manufacturing steps, a circuit configuration thereof can not be changed after manufacturing.

Recently, competition to develop electrical appliances has intensified and miniaturization continues to make progress. In these circumstances, a programmable logic circuit in which a circuit configuration thereof can be changed by an electric signal even after manufacturing and which can realize many functions on single chip draws interest. A representative example of a programmable logic circuit is a FPGA (Field-Programmable Gate Array) or a DRP (Dynamically Reconfigurable Processor) etc.

The programmable logic circuit attracts attention because of this feature, but implementation of a programmable logic circuit to an electric appliance has up to now been limited. The reason is as following.

That is, in a conventional programmable logic circuit, there have been presented problems that a size of a switching device for interconnecting a logic cell (i.e. a unit logic circuit for assembling the programmable logic circuit—the programmable logic circuit is configured by interconnecting a plurality of the logic cells using the switching device) is large, and on-resistance thereof is high. Then, in order to reduce the number of switching devices that have a large size and high on-resistance as much as possible, the conventional programmable logic circuit is configured in a manner that logic cells having as many transistors as possible are used to reduce the number of logic cells and the number of switching devices which interconnect the logic cells. As a result, the degree of freedom in combining logic cells was decreased, thus limiting functions which the programmable logic circuit could provide. That is, the size and the high on-resistance of the switching device that was used in the programmable logic circuit, limited functionality of the programmable logic circuit, thus limiting implementation of the programmable logic circuit in electric appliances.

Then, in order to diversify functionality of the programmable logic circuit and promote implementation in electric appliances, it is necessary to reduce the size of the switching device for interconnecting logic cells with each other and to decrease its on-resistance.

A switching device satisfying these requirements, which uses the conduction phenomenon of metal ions in an ion conductor (solid inside of which ions can freely move) and electrochemical reaction, has been proposed (hereinafter, called "metal atom migration switching device"). (For example, see Japanese Patent Laid-Open No. 2002-076325 and National Publication of International Patent Application No. 2002-536840).

It is known that a metal atom migration switching device is smaller than a semiconductor switching device that (that example, a MOSFET) is used often in conventional programmable logic and has a lower on-resistance. This metal atom migration switching device is widely divided into two types shown in FIGS. 1A and 1B.

FIG. 1A shows a metal atom migration switching device with a gap, and FIG. 1B shows a metal atom migration switching device without a gap. The metal atom migration switching devices shown in FIGS. 1A and 1B both are metal atom migration switching devices having two terminals.

The metal atom migration switching device with a gap shown in FIG. 1A (see Japanese Patent Laid-Open No. 2002-076325) is a metal atom migration switching device having two terminals which include an ion conducting part composed of an ion conductor ($Ag_2S$), a second electrode (Ag) for supplying metal ions ($Ag+$) to the ion conducting part, or for receiving the metal ions ($Ag+$) from the ion conducting part to precipitate metal (Ag) corresponding to the metal ions and formed to be in contact with the ion conducting part, and a first electrode (Pt) formed to have a gap with the ion conducting part. (Material shown FIG. 1A and for each component described above is exemplary).

When a negative voltage relative to the second electrode (Ag) is applied to the first electrode (Pt) as shown in FIG. 1A, electrons, after penetrating an energy barrier (tunneling) in the gap between the first electrode (Pt) and the ion conducting part, reach the surface of the ion conducting part from the first electrode (Pt) and reduce the metal ions ($Ag+$) near the surface of the ion conducting part, precipitating metal (Ag).

When the metal (Ag) is precipitated, in response to this, metal (Ag) in the second electrode is oxidized to melt in the ion conducting part as metal ions ($Ag+$), and thereby, balance between positive ions and negative ions in the ion conducting part is maintained. When the precipitated metal (Ag) on the surface of the ion conducting part grows to be in contact with the first electrode (Pt), the switching device enters a conduction (on) state (see the left drawing in FIG. 1A).

On the one hand, when a positive voltage relative to the second electrode (Ag) is applied to the first electrode (Pt), quite the reverse electrochemical reaction occurs. As a result, the precipitated metal (Ag) leaves the first electrode (Pt) and the switching device enters a non conduction (off) state (see the right drawing in FIG. 1A). In addition, as an ion conductor, a semiconductor or an insulator (for example, $Ag_2S$ is an n-type semiconductor) may be used. However, in order to operate as a switching device (to provide a conduction (on) state), it is desirable for the ion conductor to have a large contact area with the second electrode and be formed comparatively thinly.

The metal atom migration switching device without a gap shown in FIG. 1B (see National Publication of International Patent Application No. 2002-536840) is a metal atom migration switching device having two terminals which includes an ion conducting part composed of an ion conductor ($Cu_2S$), a second electrode (Cu) for supplying metal ions (Cu+) to the ion conducting part, or for receiving the metal ions (Cu+) from the ion conducting part to precipitate metal (Cu) corresponding to the metal ions, and which is formed to be in contact with the ion conducting part, and a first electrode (Ti) formed to be in contact with the ion conducting part (Material shown in FIG. 1B and for each component described above is exemplary).

When a negative voltage relative to the second electrode (Cu) is applied to the first electrode (Ti) as shown in FIG. 1B, the metal ions (Cu+) near the contact surface between the ion conducting part and the first electrode (Ti) are reduced, precipitating metal (Cu) on the contact surface between the ion conducting part and the first electrode (Ti). When the metal (Cu) is precipitated, in response to it, metal (Cu) in the second electrode is oxidized to melt in the ion conducting part as metal ions (Cu+), and thereby, balance between positive ions and negative ions in the ion conducting part is maintained.

Generally, because the ion conductor ($Cu_2S$) of the ion conducting part is softer than the first electrode (Ti), the precipitated metal (Cu) grows toward the second electrode (Cu) in the ion conducting part. When the precipitated metal (Cu) comes in contact with the second electrode (Cu), the switching device enters to a conduction (on) state (see the left drawing in FIG. 1B).

On the other hand, when a positive voltage relative to the second electrode (Cu) is applied to the first electrode (Ti), quite the reverse electrochemical reaction occurs. As a result, the precipitated metal (Cu) leaves the second electrode (Cu) and the switching device enters a non conduction (off) state (see the right drawing in FIG. 1B).

The two types of metal atom migration switching devices shown in FIGS. 1A and 1B have differences in configuration and operation described above, but in both of them, due to the electrochemical reaction, the metal atoms in the second electrode move between the first electrode and the second electrode as a precipitate to form a metal wire for making a connection between the first electrode and second electrode (when in the conduction (on) state).

The two types of metal atom migration switching devices shown in FIGS. 1A and 1B both are metal atom migration switching device each having two terminals. Such a metal atom migration switching device having two terminals has a problem of low electro-migration resistance.

Electro-migration means a phenomenon in which metal atoms collide with electrons, that are flowing in the metal wires, and which are to be moved in metal wires. In high temperature environments, the flow of electric current having a current density over a certain level is maintained in a metal wire, due to movement of the metal atoms caused by the electro-migration and a serious problem such as breakage of metal wires will occur.

As described above, in a metal atom migration switching device having two terminals, metal atoms, after moving from the second electrode to the first electrode as a precipitate due to the electrochemical reaction, form a metal wire to connect between the first electrode and the second electrode. To prevent electro-migration in this metal wire, it is necessary to increase the amount of precipitate to form a thicker metal wire and to decrease the electric current density of current flowing in the metal wire.

However, in the metal atom migration switching device having two terminals, it is not easy to increase the amount of precipitate to make the metal wire thicker. This is because, to increase the amount of precipitate, it is necessary to increase the absolute value of the negative voltage, relative to the second electrode, that is applied to the first electrode. However, once the metal wire for making a connection between the first electrode and the second electrode is formed, the voltage applied between the first electrode and the second electrode may contribute to causing a large amount of electric current to flow, but it does not contribute to increasing the amount of precipitate to make the metal wire thicker. On the contrary, if the voltage is increased to prevent electro-migration, a large amount of current flows in the metal wire, and thereby, more electro-migration may be induced.

DISCLOSURE OF THE INVENTION

Therefore, an object of the present invention is to provide a switching device that permits the amount of precipitate, that is used to form a metal wire to make a connection between a first and a second electrode, to be easily controlled, and therefore, has high electro-migration resistance, a drive and manufacturing methods for the same, an integrated circuit device and a memory device.

A switching device according to the present invention, in order to achieve the object described above, newly includes a third electrode for controlling the amount of precipitate. That is, the switching device according to the present invention is a metal atom migration switching device having three terminals. Further, the switching device according to the present invention is a metal atom migration switching device having a gap and three terminals on the base of the metal atom migration switching device with a gap shown in FIG. 1A.

Specifically, the switching device according to the present invention includes an ion conducting part having an ion conductor inside of which metal ions can freely move, a first electrode formed to have a first gap between the first electrode and the ion conducting part, a second electrode for supplying the metal ions to the ion conductor, or for receiving the metal ions from the ion conductor to precipitate metal corresponding to the metal ions and which is formed to be in contact with the ion conducting part, and a third electrode formed to have a second gap between the third electrode and the ion conducting part (see FIG. 1A).

According to such a configuration, when a negative voltage relative to the second electrode is applied to the first electrode, electrons that penetrate an energy barrier in the first gap (tunneling), electrons that become thermally excited in an insulator provided in the first gap or electrons created from impurities or defects in the insulator, reach a surface of the ion conducting part and reduce the metal ions near the surface of the ion conducting part, thus precipitating metal in the second electrode.

In response to this metal precipitation, the metal in the second electrode is oxidized to melt in the ion conducting part as metal ions, thus maintaining a balance between positive ions and negative ions in the ion conducting part. The precipitated metal on the surface of the ion conducting part grows to be in contact with the first electrode, thus providing a conduction (on) state of the switching device.

On the contrary, when a positive voltage relative to the second electrode is applied to the first electrode, quite the reverse electrochemical reaction occurs. As a result, the precipitated metal melts to allow the first electrode and the switching device enters a non conduction (off) state. The operation described above is basically the same as the operation in the metal atom migration switching device having two terminals shown in FIG. 1A.

Further, when a negative voltage relative to the second electrode is applied to the third electrode, or when a positive voltage relative to the second electrode is applied to the third electrode, the operation, also, is basically the same. At this time, after a metal wire composed of a precipitate connects between the first electrode and the second electrode, a predetermined voltage relative to the second electrode is applied to the third electrode, and thereby, the amount of precipitate and size of the metal wire dependent on it can be controlled. This is because the voltage applied to the third electrode hardly contributes to an increase in the electric current flowing in the metal wire that connects between the first electrode and the second electrode, but it contributes to an increase in the amount of precipitate. Therefore, by controlling the voltage applied to the third electrode, the size of the metal wire composed of the precipitate is allowed to become larger, and electro-migration resistance can be enhanced thereby.

In the switching device according to the present invention, the third electrode is provided and a voltage applied to this third electrode is controlled, and the size of the metal wire composed of the precipitate to connect the first electrode and the second electrode is controlled thereby. Therefore, there is provided the advantage that electro-migration can be prevented, which has been a problem for metal atom migration switching devices having two terminals.

Moreover, the switching device according to the present invention has the following advantages, because it has a configuration based on a metal atom migration switching device having a gap.

In the metal atom migration switching device having a gap, compared to the metal atom migration switching device without a gap, it is easy to adjust a switching voltage (voltage required for switching between an "on" state and an "off" state). This is because the material between the first electrode and the second electrode is limited to an ion conductor in the metal atom migration switching device without a gap, but on the contrary, in the metal atom migration switching device with a gap, a vacuum, a gas or an insulator may be used for the material. Moreover, in addition to this, more freedom in designing the structure between the first electrode and the second electrode may be provided. These reasons, just as explained above, may also apply to the three-terminal type of the switching device. Therefore, a metal atom migration switching device having a gap and three terminals according to the present invention has an advantage in that it is easier to adjust the switching voltage by controlling the voltage applied to the first electrode and the voltage applied to the third electrode, compared to a metal atom migration switching device without a gap having three terminals.

Further, in a metal atom migration switching device without a gap, because ionic conductance of the ion conductor between the first electrode and the second electrode is large and energy required for the electrochemical reaction of the ion conductor is small, the switching voltage tends to be too low. Therefore, ensuring consistency of the switching voltage with the operational voltage level of existing integrated circuit devices becomes a problem.

However, in a metal atom migration switching device with a gap, such a problem does not arise. This is because, in a metal atom migration switching device with a gap, the factor determining the switching voltage is not the ionic conductance or the energy needed for the electrochemical reaction, but the energy for exciting electrons which will reduce metal ions in the ion conductor. This reason, just as explained above, also applies to the three-terminal type, and so, in a metal atom migration switching device having a gap and three terminals according to the present invention, which differs from a metal atom migration switching device without a gap and having three terminals, the problem is not likely to occur in which the voltage applied to the first electrode and the switching voltage applied to the third electrode are too low.

BEST MODE FOR CARRYING OUT THE INVENTION

Figure 1A:
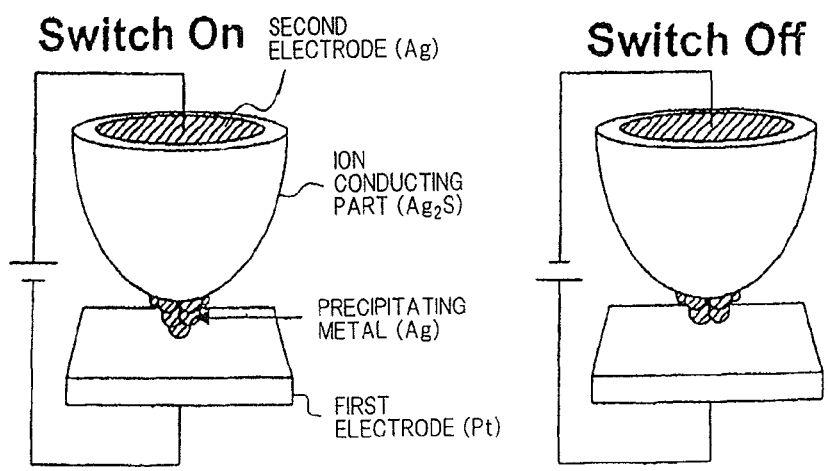
FIG. 1A is a schematic diagram illustrating a configuration and operation of a metal atom migration switching device having a gap and two terminals.

As described above, the metal atom migration switching device according to the present invention is a metal atom migration switching device having a gap and three terminals which includes an ion conducting part having an ion conductor inside of which metal ions can freely move, a first electrode positioned at a first gap away from the ion conducting part, a second electrode for supplying the metal ions to the ion conductor, or for receiving the metal ions from the ion conductor to precipitate metal corresponding to the metal ions, and which is formed to be in contact with the ion conducting part, and a third electrode positioned at a second gap away from the ion conducting part.

Now, the first to eighth embodiments of a metal atom migration switching device according to the present invention will be briefly described hereinafter.

In the first and second embodiments, a metal atom migration switching device according to the present invention will be described in relation to a basic configuration, a drive method and a manufacturing method.

The first embodiment (see FIG. 2A) is an example in which the first gap provided between the ion conducting part and the first electrode, and the second gap provided between the ion conducting part and the third electrode are filled with a vacuum or a gas.

Here, when a negative voltage relative to the second electrode is applied to the first electrode or to the third electrode, electrons which reach the surface of the ion conducting part and reduce the metal ions included in the ion conductor to precipitate metal are the electrons which penetrated the energy barrier in the first gap or the second gap.

The second embodiment (see FIG. 5A) is an example in which the first gap provided between the ion conducting part and the first electrode, and the second gap provided between the ion conducting part and the third electrode are provided with an insulator.

In this case, when a negative voltage relative to the second electrode is applied to the first electrode or the third electrode, electrons which reach the surface of the ion conducting part and reduce the metal ions included in the ion conductor to precipitate the metal are the electrons that penetrate the energy barrier in the first gap or the second gap, are the ones that thermally excited in the insulator, and are the ones that were created from impurities or defects in the insulator.

The third to fifth embodiments are examples which, in addition to the metal atom migration switching device shown in the first embodiment or the second embodiment, further include a component for limiting the direction in which the precipitate growing on the surface of the ion conducting part extends, to the direction toward the first electrode.

In the third embodiment (see FIG. 6A), a block layer formed of dense, hard material is provided on the surface of the ion conducting part on the side of the third electrode, and thereby, the precipitate growing on the surface of the ion conducting part is blocked from extending toward the third electrode, and the direction in which the precipitate can extend is limited to the direction toward the first electrode.

In the fourth embodiment (see FIG. 7A), the thickness of the gap provided between the ion conducting part and the third electrode is formed to be thinner at the region of the ion conducting part on the side of the first electrode than at the other region, and so, the electric field strength formed by a voltage relative to the second electrode applied to the third electrode becomes most powerful at this region that has a thinner gap thickness. Therefore, the direction in which the precipitate extends is limited to the direction toward the first electrode.

The fifth embodiment (see FIG. 8A), similarly to the second embodiment, is an example in which the first gap and the second gap are provided with an insulator. However, the insulator, at a region between the ion conducting part and the first electrode, has a lower resistivity than at the other region. As configured in this way, when a negative voltage relative to the second electrode is applied to the third electrode, electrons reaching the surface of the ion conducting part are concentrated on the ion conducting part on the side of the first electrode, and thereby, the direction in which the precipitate growing on the surface of the ion conducting part extends can be limited to the direction toward the first electrode.

The sixth and seventh embodiments are examples which, in addition to the metal atom migration switching device shown in the first embodiment or the second embodiment, further include a component for limiting the direction in which the precipitate growing on the surface of the ion conducting part extends, to the direction toward the first electrode, and include a component for reducing the on-resistance by directly connecting the first electrode and the second electrode with the metal wire formed of the precipitate without the ion conducting part that has a smaller electrical conductivity than that of metal.

In the sixth embodiment (see FIG. 9A), the second electrode composed of dense, hard material is laminated onto the surface of the ion conducting part on the side of the third electrode. This prevents the precipitate, growing on the surface of the ion conducting part, from extending in the direction toward the third electrode, and limits the growth direction of the precipitate to the direction toward the first electrode. Further, because the second electrode is laminated onto the ion conducting part, as the precipitate precipitated on the surface of the ion conducting part grows, it comes into contact with the second electrode. Therefore, without the ion conducting part, the first electrode and the second electrode are electrically connected to each other, thus reducing the on-resistance.

In the seventh embodiment (see FIG. 10A), the ion conducting part is laminated onto the second electrode and a block layer composed of dense, hard material is formed on the surface of the ion conducting part on the side of the third electrode. This prevents the precipitate, growing on the surface of the ion conducting part, from extending in the direction toward the third electrode, and limits the growth direction of the precipitate to the direction toward the first electrode. Further, because the ion conducting part is laminated onto the second electrode, as the precipitate precipitated on the surface of the ion conducting part grows, it comes into contact with the second electrode. Therefore, without the ion conducting part, the first electrode and the second electrode are electrically connected to each other, thus reducing the on-resistance.

The eighth embodiment (see FIG. 11A) is a metal atom migration switching device having a gap and three terminals which includes an ion conducting part having an ion conductor inside of which metal ions can freely move, a first electrode formed on the ion conducting part to be in contact with the ion conducting part, a second electrode positioned on the ion conducting part at a predetermined distance away from the first electrode, for supplying the metal ions to the ion conductor, or receiving the metal ions from the ion conductor to precipitate metal corresponding to the metal ions, and formed to be in contact with the ion conducting part, and a third electrode formed at a gap with the ion conducting part.

The metal atom migration switching device of the eighth embodiment is different from the metal atom migration switching devices shown in the first to seventh embodiments, and it is configured so that the first electrode is in contact with the ion conducting part. However, since the first electrode and the second electrode are formed on the ion conducting part at a predetermined distance from each other, the precipitate for forming the metal wire to connect the first electrode and the second electrode is not formed inside the ion conducting part as is the case of the metal atom migration switching device without a gap, but it is formed on a surface of the ion conducting part lying between the first electrode and the second electrode. In the case where the precipitate is formed on the surface of the ion conducting part in this way, by applying a voltage to the third electrode positioned at the gap away from the ion conducting part, the amount of the precipitate and the size of the metal wire depending on it can be controlled. Although the first electrode is in contact with the ion conducting part, the metal atom migration switching device of the eighth embodiment, may be considered to be the metal atom migration switching device with a gap.

Now, the first to eighth embodiments of the metal atom migration switching device according to the present invention will be hereinafter described with reference to the accompanying drawings.

First Embodiment

Figure 2A:
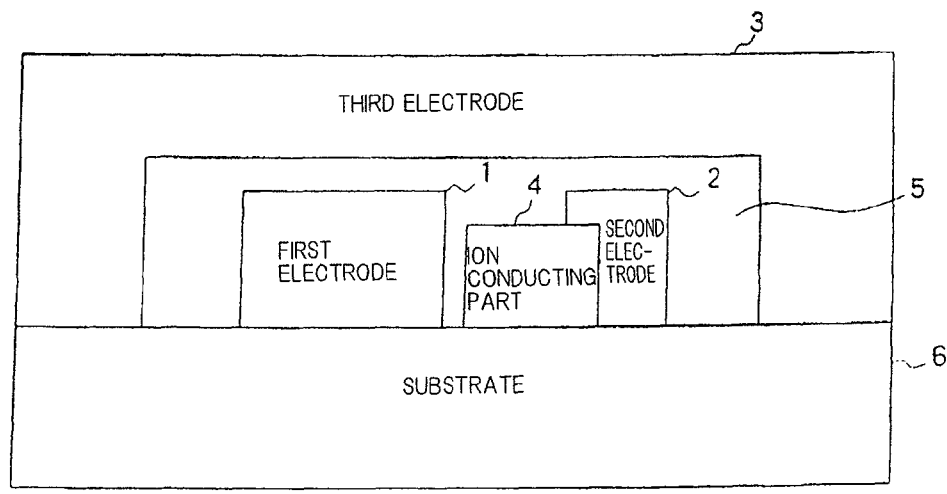
FIG. 2A is a schematic diagram illustrating a configuration of a first embodiment of a metal atom migration switching device having a gap and three terminals according to the present invention.
Figure 2B:
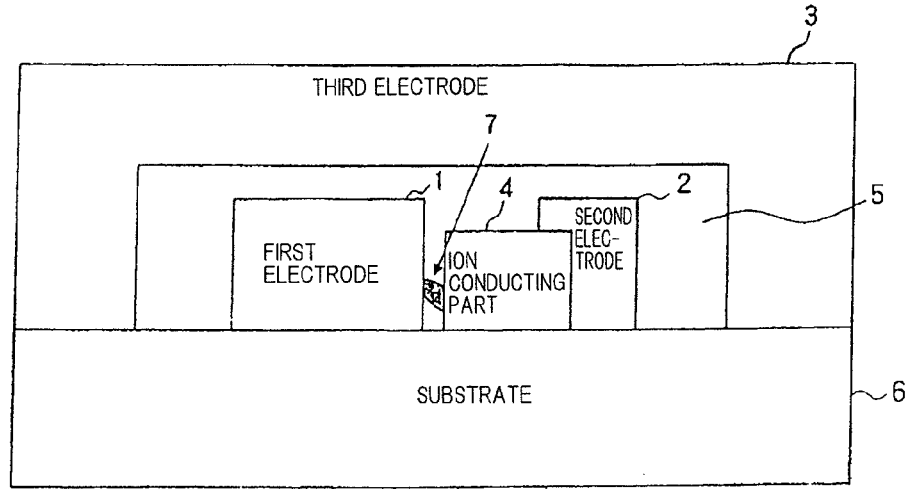
FIG. 2B is a schematic diagram illustrating growth of a precipitate for forming a metal wire between a first electrode and a second electrode shown in FIG. 2A.

FIG. 2A is a schematic diagram illustrating a configuration of a first embodiment of a metal atom migration switching device having a gap and three terminals according to the present invention. FIG. 2B is a schematic diagram illustrating growth of a precipitate for forming a metal wire between a first electrode and a second electrode shown in FIG. 2A.

As shown in FIG. 2A, the metal atom migration switching device of the first embodiment is configured in a manner that ion conducting part 4 composed of an ion conductor ($Cu_2S$) is formed on insulating substrate 6 ($SiO_2$), and second electrode 2 for supplying metal ions ($Cu+$) to ion conducting part 4, or for receiving the metal ions ($Cu+$) from ion conducting part 4 to precipitate metal (Cu) that correspond to the metal ions is formed on substrate 6 to be in contact with ion conducting part 4.

Further, on substrate 6, first electrode 1 (Pt) is formed at a first gap with ion conducting part 4. Moreover, on substrate 6, third electrode 3 (Pt) is formed at a second gap with ion conducting part 4. The first gap and the second gap form a part of gap 5, respectively.

In the first embodiment, gap 5 may be a vacuum or may be filled with a gas. The first gap and the second gap have a thickness of about 1 nm to about 10 nm.

For the ion conductor of ion conducting part 4, $Cu_2S$, compounds of chalcogen elements (O, S, Se, Te) and metal, insulators including silicon (silicon oxide, silicon nitride, silicon oxynitride), perovskite oxides ($ABO_3$, A: Mg, Ca, Sr, Ba, B: Ti) etc. may be used.

For the metal of second electrode 2, Cu, Ag, Pb etc. may be used.

For the material of first electrode 1 and third electrode 3, Pt, metal having a high-melting point (W, Ti, Ta, Mo), silicide (titanium silicide, cobalt silicide, molybdenum silicide) etc. may be used.

Next, operation of the metal atom migration switching device of the first embodiment will be described.

For example, when a negative voltage relative to second electrode 2 is applied to first electrode 1, electrons which penetrated an energy barrier in the first gap between first electrode 1 and ion conducting part 4 reach a surface of ion conducting part 4 and reduce metal ions ($Cu+$) near the surface of ion conducting part 4, precipitating the same metal (Cu) as material of second electrode 2. In response to precipitation of the metal, the metal (Cu) of second electrode 2 is oxidized to melt in ion conducting part 4 as the metal ions ($Cu+$), and thereby, balance between positive ions and negative ions in ion conducting part 4 is maintained. When the precipitated metal that is precipitated on the surface of ion conducting part 4 grows to be in contact with first electrode 1, the metal atom migration switching device enters a conduction (on) state (see FIG. 2B). On the one hand, when a positive voltage relative to second electrode 2 is applied to first electrode 1, quite the reverse electrochemical reaction described above occurs. As a result, the precipitated metal melts to separate from first electrode 1, and the metal atom migration switching device enters a non conduction (off) state. (The operation described above is basically the same as the operation of the metal atom migration switching device having a gap and two terminals shown in FIG. 11A).

Further, when a negative voltage relative to second electrode 2 is applied to third electrode 3, or when a positive voltage relative to second electrode 2 is applied to third electrode 3, operation is also basically the same. At this time, even after the metal wire composed of precipitate 7 shown in FIG. 3B electrically connects first electrode 1 and second electrode 2, a voltage relative to second electrode 2 is applied to third electrode 3, and thereby, the amount of precipitate 7 and the size of the metal wire dependent on it can be controlled. This is because the voltage applied to third electrode 3 can hardly contribute to an increase in electric current that flows in the metal wire for connecting first electrode 1 and second electrode 2, but it may contribute to an increase in the amount of precipitate 7.

Therefore, by controlling the voltage relative to second electrode 2 applied to third electrode 3, the size of the metal wire composed of precipitate 7 is allowed to be larger, and electro-migration resistance can be enhanced thereby.

Figure 3A:
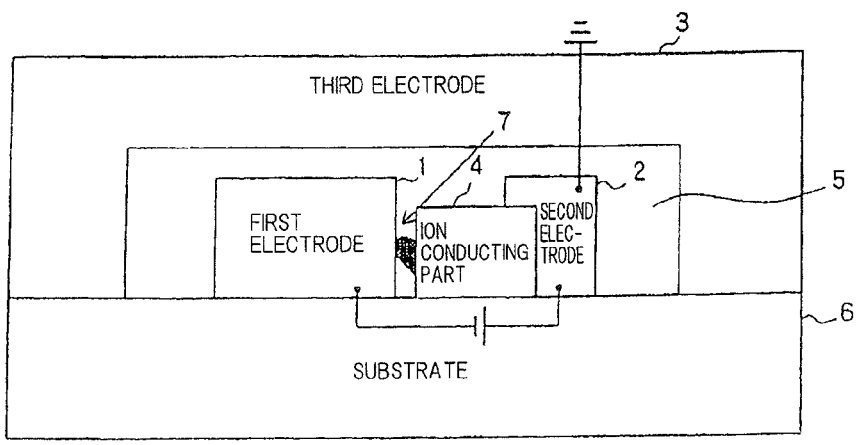
FIG. 3A is a diagram illustrating one example of a drive method for the metal atom migration switching device having a gap and three terminals shown in FIG. 2A, and also a schematic diagram illustrating growth of the precipitate that forms the metal wire between the first electrode and the second electrode, when a negative voltage relative to the second electrode is applied to the first electrode.

FIG. 3A is a view illustrating one example of a drive method for the metal atom migration switching device having a gap and three terminals shown in FIG. 2A, and is also a schematic diagram illustrating growth of the precipitate that forms the metal wire between the first electrode and the second electrode, when a negative voltage relative to the second electrode is applied to the first electrode. Further, FIG.

3B is a view illustrating one example of a drive method for the metal atom migration switching device having a gap and three terminals shown in FIG. 1A, and is also a schematic diagram illustrating an increase in the size of the metal wire, when a negative voltage relative to the second electrode is applied to the third electrode.

Figure 3B:
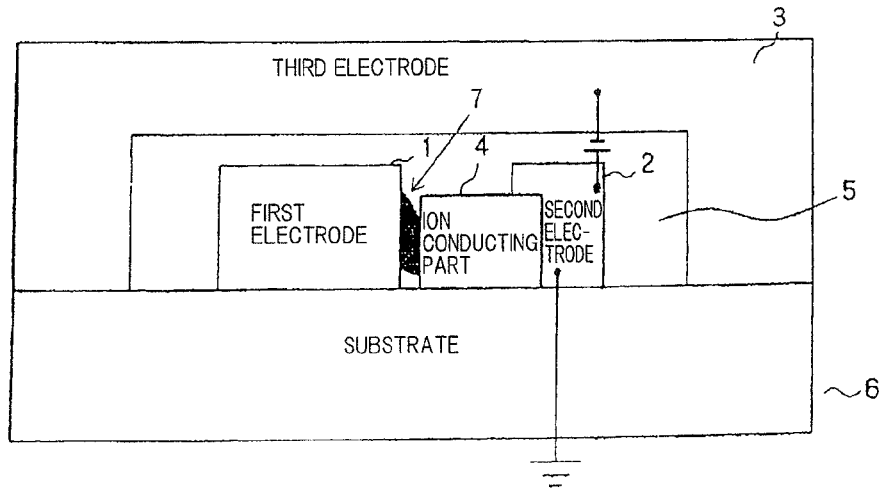
FIG. 3B is a diagram illustrating one example of a drive method for the metal atom migration switching device having a gap and three terminals shown in FIG. 1A, and also a schematic diagram illustrating an increase in size of the metal wire, when a negative voltage relative to the second electrode is applied to a third electrode.

As shown in FIG. 3A, by applying a negative voltage relative to second electrode 2 to first electrode 1, ion conducting part 4 and first electrode 1 are connected to each other with precipitate 7. Next, as shown in FIG. 3B, growth of precipitate 7 is promoted by applying a negative voltage relative to second electrode 2 to third electrode 3, thus enlarging the size of the metal wire composed of precipitate 7. Subsequently, application of a negative voltage or a positive voltage relative to second electrode 2 to third electrode 3 causes precipitate 7 to come into contact with first electrode 1 or to leave first electrode 1, and thereby, the on/off operation of the metal atom migration switching device can be controlled.

In addition, in FIG. 3A, precipitate 7 grows due to the application of a negative voltage relative to second electrode 2 to first electrode 1, but, if it can be assured that precipitate 7 grows only in the direction toward first electrode 1, the application of a negative voltage relative to second electrode 2 to third electrode 3 may grow precipitate 7. For example, in the third to seventh embodiments described below, a configuration in which the growth direction of the precipitate is limited to the direction toward first electrode 1 is adopted. Therefore, by adopting such a configuration, a method for growing precipitate 7 using the application of a negative voltage relative to second electrode 2 to third electrode 3 is effective. Similarly, also in the eighth embodiment described below, there is shown a method in which the growth direction of the precipitate is limited between the first electrode and the second electrode, and so, by adopting this configuration, a method for growing precipitate 7 using the application of a negative voltage relative to second electrode 2 to third electrode 3 is effective.

Next, a method for manufacturing a metal atom migration switching device of the first embodiment will be described.

First, photoresist is coated on substrate 6 ($SiO_2$), and an opening of the photoresist is formed on a formation area of first electrode 1 by ultraviolet irradiation and development processing. Next, a Pt film to form first electrode 1 is deposited and first electrode 1 having a thickness of about 1 nm to 100 nm is formed using the liftoff method. According to similar procedures, ion conducting part 4 ($Cu_2S$) having a thickness of about 1 nm to 100 nm is formed, and further, second electrode 2 (Cu) having a thickness of about 1 nm to 100 nm is formed. In addition, a distance of 1 nm to 10 nm is provided between ion conducting part 4 and first electrode 1 (for forming the first gap). Next, a resist pattern is provided so as to cover ion conducting part 4, first electrode 1 and second electrode 2. At this time, the resist is formed on ion conducting part 4 to have a thickness of 1 nm to 10 nm (for forming the second gap).

Next, third electrode 3 is formed on this resist. After formation of third electrode 3, the first gap between ion conducting part 4 and first electrode 1, and the second gap between ion conducting part 4 and third electrode 3 are formed by removing the resist using an organic solvent such as acetone. In addition, the first gap and the second gap may be filled with a gas such as air.

In manufacturing the metal atom migration switching device of the first embodiment, it is difficult to control the thickness of the first gap between ion conducting part 4 and first electrode 1.

Figure 4A:
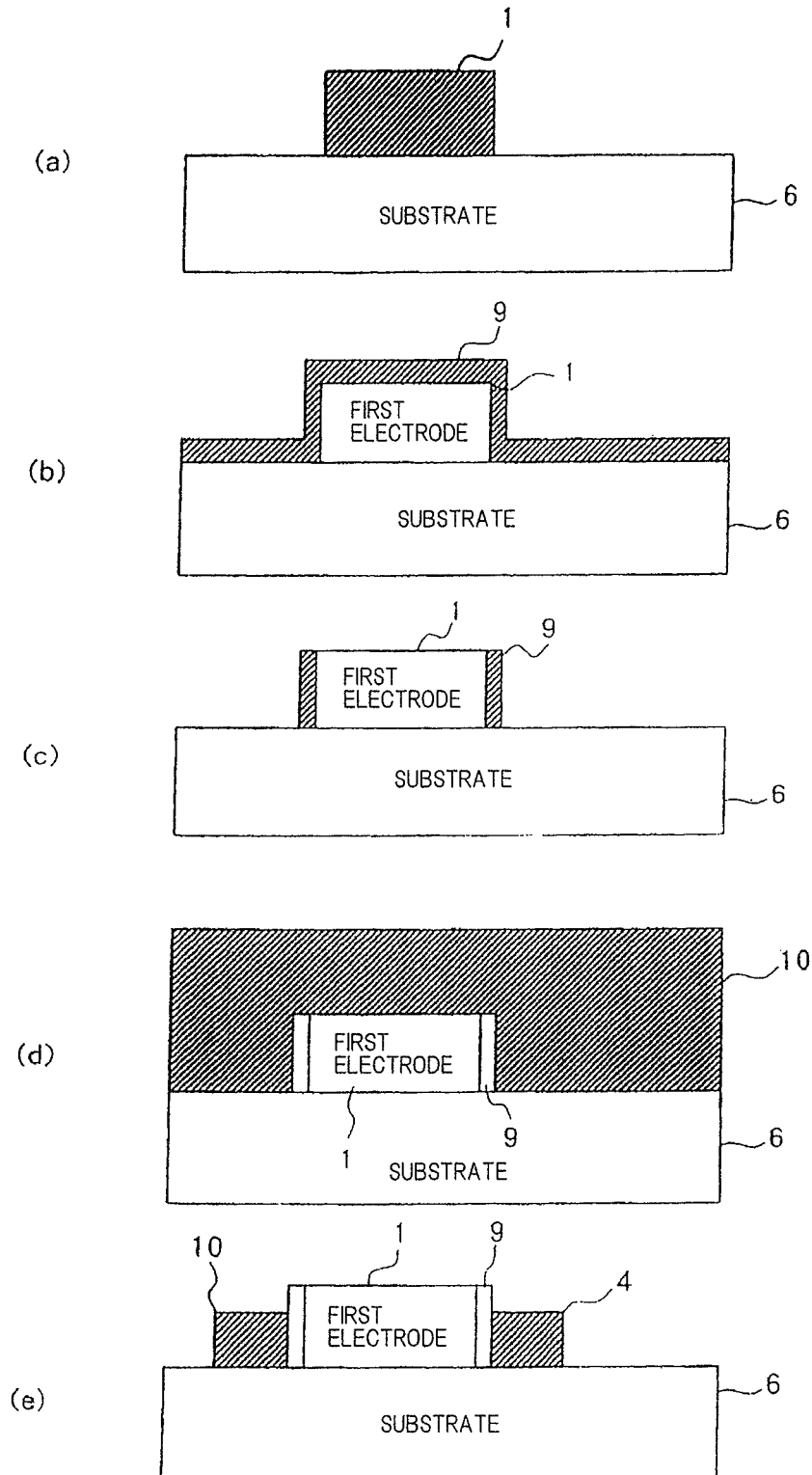
FIG. 4A is a side sectional view illustrating manufacturing steps for a metal atom migration switching device having a gap and three terminals according to the present invention.
Figure 4B:
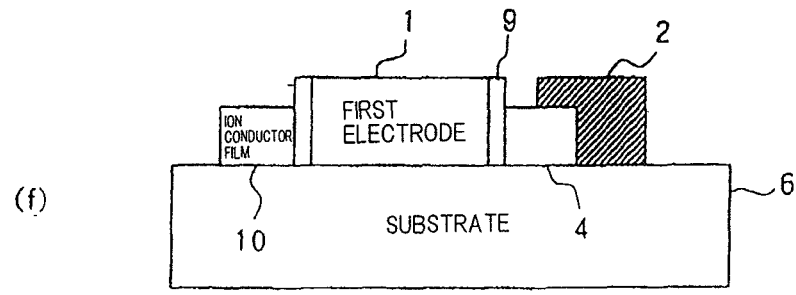
FIG. 4B is a side sectional view illustrating manufacturing steps for a metal atom migration switching device having a gap and three terminals according to the present invention.
Figure 4B:
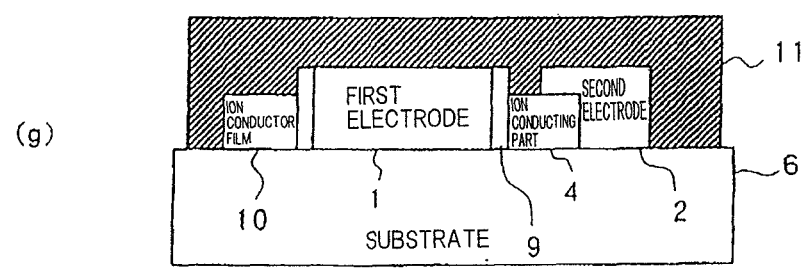
Figure 4B:
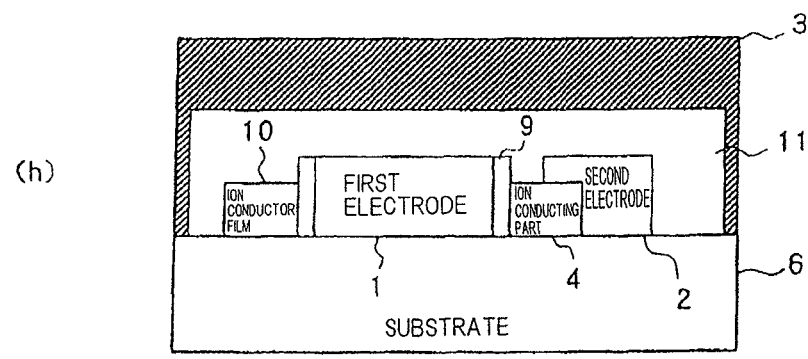
Figure 4B:
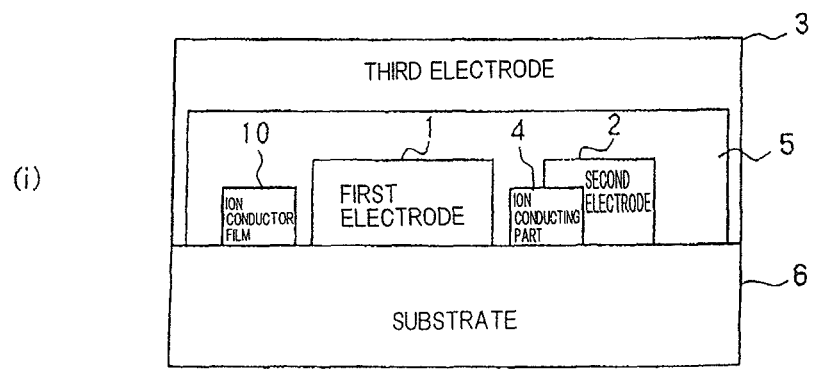

FIGS. 4A and 4B show manufacturing procedures for forming the first gap to have a desired thickness.

First, on substrate 6, a Pt film to form first electrode 1 is grown to a thickness of about 100 nm using a sputtering method (FIG. 4A(a)). Next, this Pt film is processed by lithographic technique and dry etching technology, forming first electrode 1. Next, insulating film 9 ($SiO_2$) is grown to a thickness of about 10 nm entirely on substrate 6 including first electrode 1 (FIG. 4A(b)).

Next, insulating film 9 is removed using an anisotropic dry etching method, with a side wall part of first electrode 1 being left behind (FIG. 4A(c)).

Next, ion conductor film 10 ($Cu_2S$) is grown to a thickness of about 50 nm on substrate 6 so as to cover first electrode 1 using a laser ablation method (FIG. 4A(d)).

Next, ion conductor film 10 is removed using anisotropic dry etching method, while only the part of insulating film 9 that was left behind on the side wall part of first electrode 1 is left behind (FIG. 4A(e)). At this time, ion conductor film 10 shown in the right side of FIG. 4A(e) becomes ion conducting part 4.

Next, second electrode 2 composed of a Cu film having a thickness of about 50 nm is formed using a liftoff method (FIG. 4B(f)).

Next, insulating film 11 ($SiO_2$) having a thickness of about 20 nm is grown entirely on substrate 6 to cover first electrode 1 (FIG. 4B(g)).

Next, a Pt film having a thickness of about 100 nm is formed to cover insulating film 11, and this Pt film is processed by a lithographic technique and dry etching technology, forming third electrode 3 (FIG. 4B(h)).

Finally, insulating film 9 and insulating film 11 are removed using a wet etching method, respectively, forming gap 5 (FIG. 4B(i)). Gap 5 may be filled with a gas.

According to the manufacturing method described above, because the thickness of the first gap between ion conducting part 4 and first electrode 1 can be controlled by the thickness of insulating film 9 that is formed in the step shown in FIG. 4A(b)), the thickness of the first gap can be easily controlled.

Second Embodiment

Figure 5A:
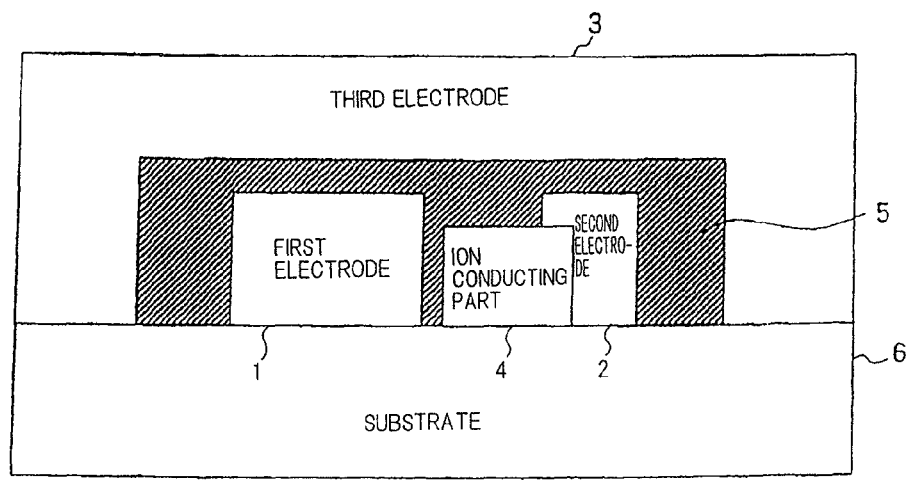
FIG. 5A is a schematic diagram illustrating a configuration of a second embodiment of a metal atom migration switching device having a gap and three terminals according to the present invention.
Figure 5B:
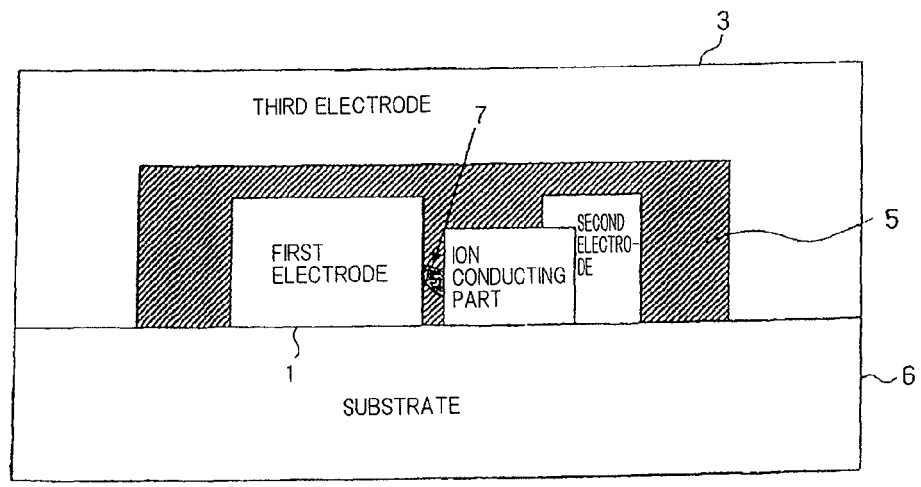
FIG. 5B is a schematic diagram illustrating growth of a precipitate for forming a metal wire between a first electrode and a second electrode shown in FIG. 5A.

FIG. 5A is a schematic diagram illustrating a configuration of a second embodiment of a metal atom migration switching device having a gap and three terminals according to the present invention. FIG. 5B is a schematic diagram illustrating growth of a precipitate for forming a metal wire between a first electrode and a second electrode shown in FIG. 5A.

In the metal atom migration switching device of the first embodiment is configured such that gap 5 is filled with the vacuum or a gas as shown, but the metal atom migration switching device of the second embodiment is configured so that gap 5 includes an insulator (for example, a resist or $SiO_2$). According to this difference in configuration, the following difference in operation of the metal atom migration switching device is generated. That is, in the first embodiment, when a negative voltage relative to second electrode 2 is applied to first electrode 1 or to third electrode 3, electrons which reach the surface of ion conducting part 4 to reduce the metal ions included in ion conducting part 4 are the ones which penetrated the energy barrier in the first gap or the second gap (tunneling).

On the one hand, in the second embodiment, since gap 5 includes the insulator (solid), the electrons which reach the surface of ion conducting part 4 to reduce the metal ions included in ion conducting part 4 are not limited to the ones which penetrated the energy gap in the gap (tunneling), but include the ones that were thermally excited in the insulator and the ones that were created from impurities and defects in the insulator (here, the insulator means a substance having a band gap at a distance, including a semiconductor).

As stated above, since the second embodiment uses the electrons in the insulator, it is not necessary to make the first gap and the second gap as thin as in the first embodiment. It may be sufficient that the thickness of the first gap and the second gap is about 1 nm to 100 nm.

A method for manufacturing the metal atom migration switching device of the second embodiment can only be provided by omitting the step of removing the insulator (FIG. 4B(i)) from the steps shown in the first embodiment.

As shown in the first and second embodiments, the metal atom migration switching device according to the present invention is the metal atom migration switching device with a gap, and so, the material for filling gap 5 can be comparatively freely changed. Therefore, it has the following advantages.

In the metal atom migration switching device with a gap, compared to the metal atom migration switching device without a gap, it is easy to adjust the switching voltage (voltage needed for switching between an on state and an off state). This is because the material between the first electrode and the second electrode is limited to an ion conductor in the metal atom migration switching device without a gap, but, on the contrary, in the metal atom migration switching device with a gap, the material can be selected from among a vacuum, a gas and an insulator etc., providing higher freedom in the design of a structure between the first electrode and the second electrode. This reason, just as explained above, also applies to the three-terminal type, and it is easier to adjust the switching voltage applied to the first electrode or the third electrode in the metal atom migration switching device having a gap and three terminals according to the present invention than in the metal atom migration switching device without a gap and having three terminals.

Further, in the metal atom migration switching device without a gap, the ion conductor between the first electrode and the second electrode has a large ionic conductance and needs small amount of energy for the electrochemical reaction in the ion conductor, and so, the switching voltage tends to be too small. Therefore, there arises the problem of consistency with operational voltages in existing integrated circuit devices. On the one hand, in the metal atom migration switching device with a gap, such a problem is not likely to occur. This is because, in the metal atom migration switching device having a gap, the factor that determines the switching voltage is not the ionic conductance or the energy that is needed for the electrochemical reaction, but is energy that is needed to excite electrons which will reduce metal ions in the ion conductor. This reason, just as explained above, applies to the three-terminal type, and so, in the metal atom migration switching device having a gap and three terminals according to the present invention, that is different from the metal atom migration switching device without a gap and having three terminals, the problem is likely not to occur that the switching voltage applied to the first electrode or the third electrode is too low.

In addition, when the insulator is used for ion conducting part 4, an insulator having a lower ionic conductance than that of an insulator used for ion conductor 4 is preferably used for gap 5. For example, when $SiO_2$ is used for ion conducting part 4, SiN having a lower ionic conductance than that of $SiO_2$ is preferably used for the insulator in gap 5.

Third Embodiment

Figure 6A:
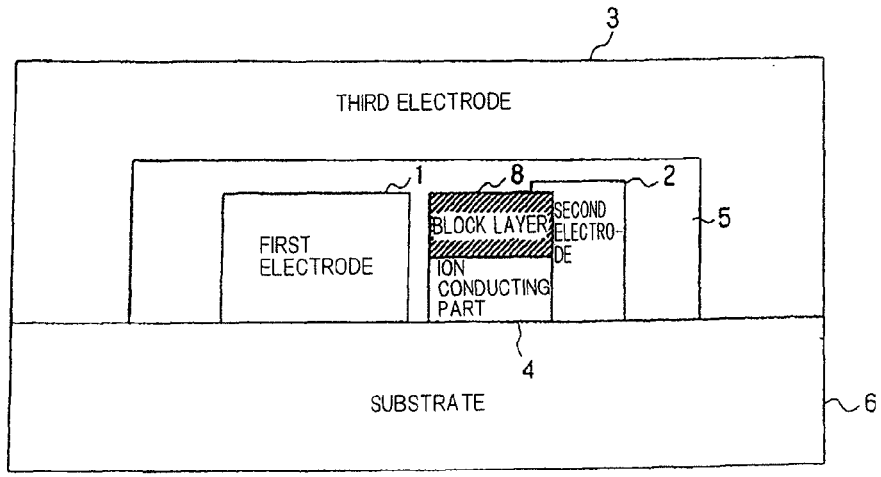
FIG. 6A is a schematic diagram illustrating a configuration of a third embodiment of a metal atom migration switching device having a gap and three terminals according to the present invention.
Figure 6B:
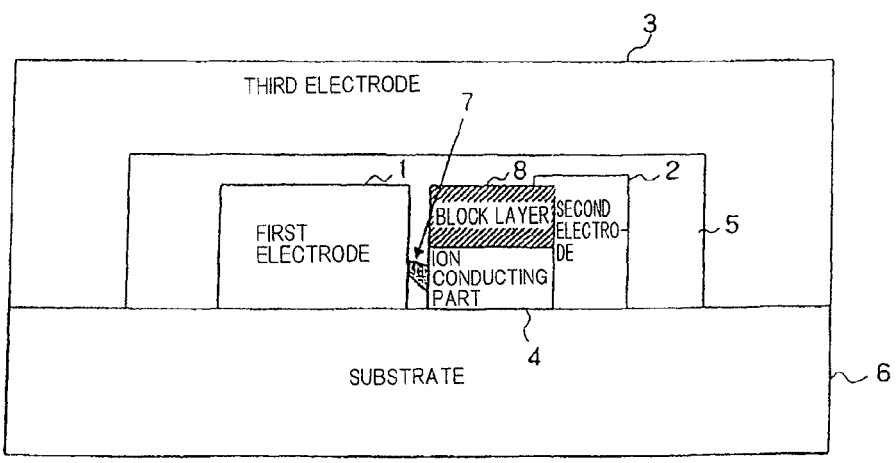
FIG. 6B is a schematic diagram illustrating growth of a precipitate for forming a metal wire between a first electrode and a second electrode shown in FIG. 6A.

FIG. 6A is a schematic diagram illustrating a configuration of a third embodiment of a metal atom migration switching device having a gap and three terminals according to the present invention. FIG. 6B is a schematic diagram illustrating growth of a precipitate for forming a metal wire between a first electrode and a second electrode shown in FIG. 6A.

As shown in FIG. 6A, the metal atom migration switching device of the third embodiment is different from the metal atom migration switching device of the first embodiment in the point that, block layer 8 is formed, on a surface of ion conducting part 4 on the side of third electrode 3. For block layer 8, dense, hard material such as $SiO_2$ is preferably used.

This difference generates the following difference in operation of the metal atom migration switching device. That is, since block layer 8 is composed of dense, hard material, precipitate 7 does not grow toward the side of block layer 8 of ion conducting part 4 and does not extend in the direction toward third electrode 3. As a result, the growth direction of precipitate 7 is limited to the direction from ion conducting part 4 toward first electrode 1.

This provides the advantage that wrong operation of the metal atom migration switching device (for example, an operation in which precipitate 7 extends in the direction toward third electrode 3 to be in contact with third electrode 3) can be prevented. Further, as described above, it is advantageous, when the drive method, in which a voltage relative to second electrode 2 is applied to third electrode 3, is adopted.

A method for manufacturing the metal atom migration switching device of the third embodiment is provided by adding a step of forming block layer 8 using a liftoff method between the formation step (liftoff method) for ion conducting part 4 shown in FIG. 4A(e) and the formation step (liftoff method) for second electrode 2 shown in FIG. 4B(f).

In addition, the metal atom migration switching device of the third embodiment may also include an insulator in gap 5, similarly to the second embodiment.

Fourth Embodiment

Figure 7A:
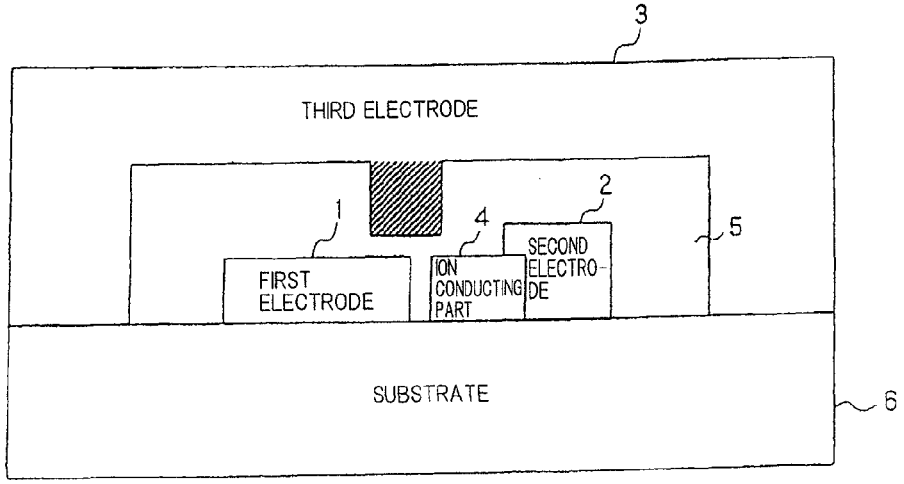
FIG. 7A is a schematic diagram illustrating a configuration of a fourth embodiment of a metal atom migration switching device having a gap and three terminals according to the present invention.
Figure 7B:
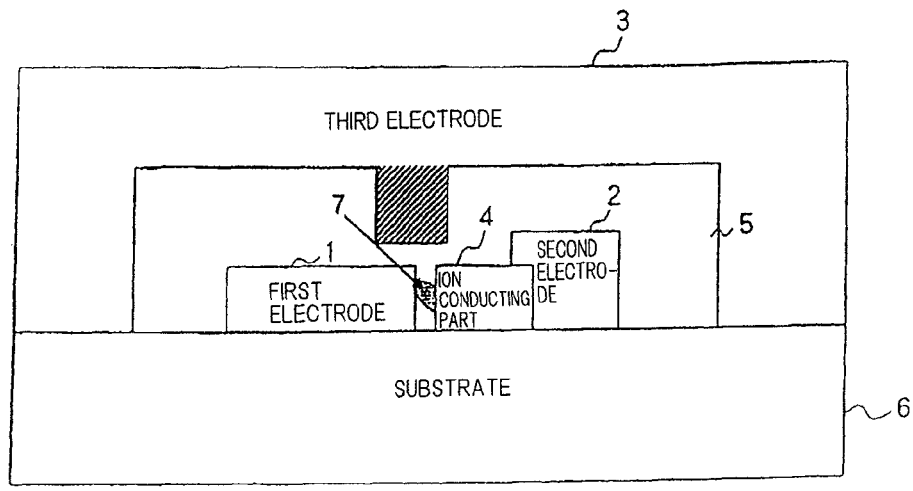
FIG. 7B is a schematic diagram illustrating growth of a precipitate for forming a metal wire between a first electrode and a second electrode shown in FIG. 7A.

FIG. 7A is a schematic diagram illustrating a configuration of a fourth embodiment of a metal atom migration switching device having a gap and three terminals according to the present invention. FIG. 7B is a schematic diagram illustrating growth of a precipitate for forming a metal wire between a first electrode and a second electrode shown in FIG. 7A.

As shown in FIG. 7A, the metal atom migration switching device of the fourth embodiment is configured so that a thickness of gap 5 provided between ion conducting part 4 and third electrode 3 is formed to be thinner at the region of ion conducting part 4 on the side of first electrode 1 than at another region. That is, the thickness of a region corresponding to the first gap between ion conducting part 4 and first electrode 1 in the first gap is formed thinner than that of the other region including the second gap. Therefore, it is different from the metal atom migration switching device of the first embodiment in the point that third electrode 3 is formed in a convex shape at this region in which gap 5 is thinner.

This difference generates a difference in operation of the metal atom migration switching device as described below. That is, when a negative voltage relative to second electrode 2 is applied to third electrode 3, the electric field strength that is created by a gate voltage becomes powerful especially at the first gap between ion conducting part 4 and first electrode 1. Therefore, more electrons which will reduce the metal ions near the surface of ion conducting part 4 reach the surface of ion conducting part 4 on the side of first electrode 1. As a result, the direction in which precipitate 7 extends is limited to the direction from ion conducting part 4 toward first electrode 1 (see FIG. 7B). Therefore, there is provided the advantage that wrong operation of the metal atom migration switching device (for example, an operation in which precipitate 7 extends in the direction toward third electrode 3 to be in contact with third electrode 3) can be prevented. Further, as described above, it is advantageous, when the drive method, in which a voltage relative to second electrode 2 is applied to third electrode 3, is adopted.

A method for manufacturing the metal atom migration switching device of the fourth embodiment is provided by adding a step, to the step shown in FIG. 4B(g), for processing the resist (or insulating film) for forming gap 5 to be in a convex shape. As an example, in relation to the case where gap 5 includes resist, the method for manufacturing the metal atom migration switching device of the fourth embodiment will be described hereinafter, but it also applies to the case where insulating film is used.

According to the manufacturing method of this embodiment, after formation of second electrode 2, a first resist pattern is formed, and on it, a second resist pattern is formed. Subsequently, the second resist is removed from a region at the first gap between ion conducting part 4 and first electrode 1.

For example, for the first resist pattern, calixarene is used, and for the second resist pattern, novolac resist is used, and thereby, the second resist pattern can be formed using an alkali aqueous solution without destruction of the first resist pattern.

Next, on these resist, third electrode 3 is formed, and thereby third electrode 3 can be formed to be in a convex shape in the region at the first gap between ion conducting part 4 and first electrode 1.

In addition, the metal atom migration switching device of the fourth embodiment may also include the insulator in gap 5, similarly to the metal atom migration switching device of the second embodiment. Further, block layer 8 shown in the third embodiment may be formed on the surface of ion conducting part 4 on the side of third electrode 3.

Fifth Embodiment

Figure 8A:
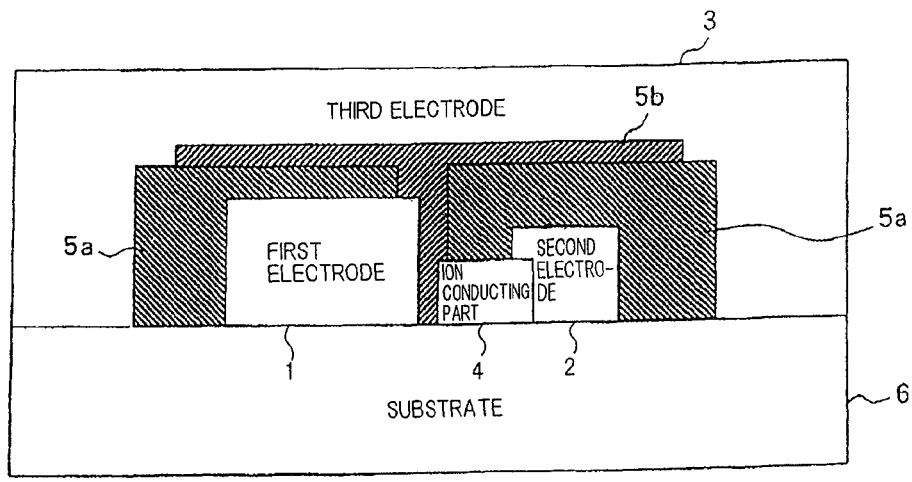
FIG. 8A is a schematic diagram illustrating a configuration of a fifth embodiment of a metal atom migration switching device having a gap and three terminals according to the present invention.
Figure 8B:
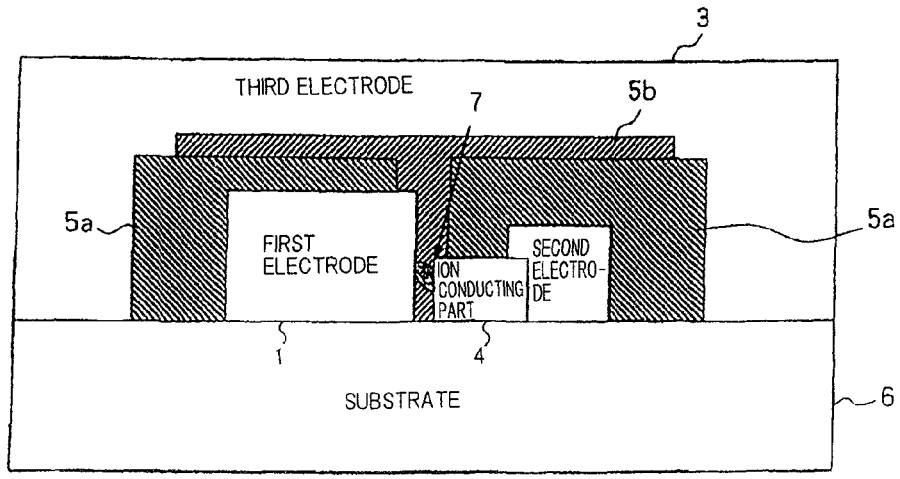
FIG. 8B is a schematic diagram illustrating growth of a precipitate forming a metal wire between a first electrode and a second electrode shown in FIG. 8A.

FIG. 8A is a schematic diagram illustrating a configuration of a fifth embodiment of a metal atom migration switching device having a gap and three terminals according to the present invention. FIG. 8B is a schematic diagram illustrating growth of a precipitate that forms a metal wire between a first electrode and a second electrode shown in FIG. 8A.

As shown in FIG. 8A, the metal atom migration switching device of the fifth embodiment includes low-resistance insulating material 5b at the first gap between ion conducting part 4 and first electrode 1, and high-resistance insulating material 5a at the other region of gap 5. That is, it is different from the metal atom migration switching device of the first embodiment in the point that the insulator included in gap 5 is configured to have a resistivity that is lower at the region between the ion conducting part 4 and first electrode 1 than at another region.

Because the metal atom migration switching device of the fifth embodiment includes the insulator in gap 5 similarly to the second embodiment, it may be sufficient that the thickness of the first gap and the second gap is about 1 nm to about 100 nm.

This difference generates a difference in operation of the metal atom migration switching device as described below. That is, when a negative voltage relative to second electrode 2 is applied to third electrode 3, electrons which will reduce the metal ions near the surface of the ion conductor are directed to the first gap, including low-resistance insulating material 5b, and so, most of which will reach the surface of ion conducting part 4 on the side of first electrode 1, and they scarcely reach the surface of ion conducting part 4 on the side of third electrode 3. As a result, the growth direction of precipitate 7 is limited to the direction from ion conducting part 4 to first electrode 1 (see FIG. 8B).

Therefore, there is provided the advantage that wrong operation of the metal atom migration switching device (for example, operation in which precipitate 7 extends in the direction toward third electrode 3 to be in contact with third electrode 3) can be prevented. Further, as described above, it is advantageous, when the drive method, in which a voltage relative to second electrode 2 is applied to third electrode 3, is adopted.

A method for manufacturing the metal atom migration switching device of the fifth embodiment is provided by changing the step of forming the resist (or insulating film) shown in FIG. 4B(g) to another step. In the following description, the method for manufacturing the metal atom migration switching device of the fifth embodiment will be described in relation to the case where gap 5 includes the resist, as an example, but it similarly applies to the case of the insulating film.

In the manufacturing method of this embodiment, after formation of second electrode 2, photoresist (to form high-resistance material 5a) is completely coated, and the photoresist is removed from an area except the area of switching device and from a region for forming the first gap between ion conducting part 4 and first electrode 1, respectively, using photolithographic technique.

Next, conductive resist (to form low-resistance material 5b) is completely coated, and the conductive resist is removed from the area except the area of switching device using photolithographic technique. Subsequently, third electrode 3 is formed.

In addition, also in the metal atom migration switching device of the fifth embodiment, a block layer shown in the third embodiment may be formed on the surface of ion conducting part 4 on the side of third electrode 3, and the thickness of the region corresponding to the first gap between ion conducting part 4 and first electrode 1 in the first gap may be formed to be thinner than that of the other region including the second gap as shown in the fourth embodiment.

Sixth Embodiment

Figure 9A:
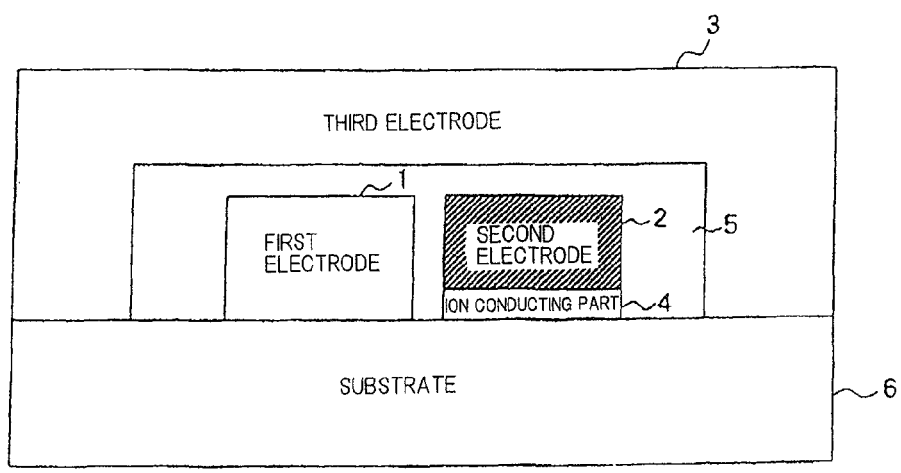
FIG. 9A is a schematic diagram illustrating a configuration of a sixth embodiment of a metal atom migration switching device having a gap and three terminals according to the present invention.
Figure 9B:
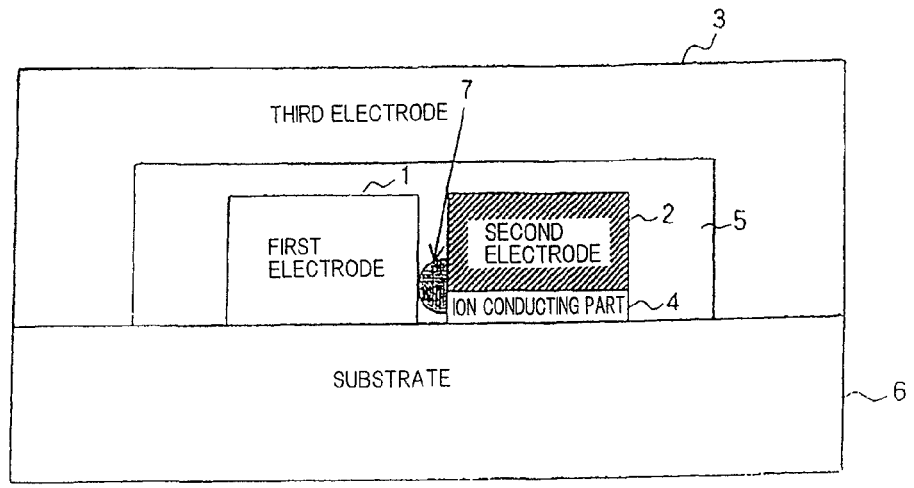
FIG. 9B is a schematic diagram illustrating growth of a precipitate for forming a metal wire between a first electrode and a second electrode shown in FIG. 9A.

FIG. 9A is a schematic diagram illustrating a configuration of a sixth embodiment of a metal atom migration switching device having a gap and three terminals according to the present invention. FIG. 9B is a schematic diagram illustrating growth of a precipitate for forming a metal wire between a first electrode and a second electrode shown in FIG. 9A.

As shown in FIG. 9A, the metal atom migration switching device of the sixth embodiment is different from the metal atom migration switching device of the first embodiment in the point that second electrode 2 is formed on the surface of ion conducting part 4 on the side of third electrode 3.

Such a difference generates the following difference in operation of the metal atom migration switching device. That is, because second electrode 2 is formed of dense, hard material such as Cu, precipitate 7 will not grow to reach the inside of second electrode 2. As a result, the growth direction of precipitate 7 is limited to the direction from ion conducting part 4 toward the first electrode.

Therefore, there is provided the advantage that wrong operation of the metal atom migration switching device (for example, an operation in which precipitate 7 extends in the direction toward third electrode 3 to be in contact with third electrode 3) can be prevented. Further, as described above, it is advantageous, when the drive method, in which a voltage relative to second electrode 2 is applied to third electrode 3, is adopted.

Further, in the metal atom migration switching device of the sixth embodiment, because second electrode 2 is laminated onto ion conducting part 4, as the size of the metal wire composed of precipitate 7 that grows in the direction from ion conducting part 4 toward first electrode 1 is increased, it is in contact with second electrode 2 as shown in FIG. 9B.

The ion conductor of ion conducting part 4 has smaller electric conductivity than that of metal. Therefore, connection between first electrode 1 and second electrode 2 through ion conducting part 4 has a larger on-resistance than that of direct connection through the metal wire composed of precipitate 7. Reduction in the on-resistance is a very important advantage because of the consideration that reduction is specially required for a switching device in order to diversify functionality of the programmable logic and to promote implementation of it in electric appliances (see the section of BACKGROUND ART).

A method for manufacturing the metal atom migration switching device of the sixth embodiment is such that, in the step of forming second electrode 2 shown in FIG. 4B(f), second electrode 2 is formed on ion conducting part 4 using a liftoff method.

In addition, the metal atom migration switching device of the sixth embodiment, similarly to the second embodiment, may also include the insulator in gap 5. Further, the thickness of the region that corresponds to the first gap between ion conducting part 4 and first electrode 1 in the first gap may be formed thinner than that of the other region including the second gap as shown in the fourth embodiment, and the insulator also may be configured to have a lower resistivity at the region between ion conducting part 4 and first electrode 1 than that at the other region as shown in the fifth embodiment.

Seventh Embodiment

Figure 10A:
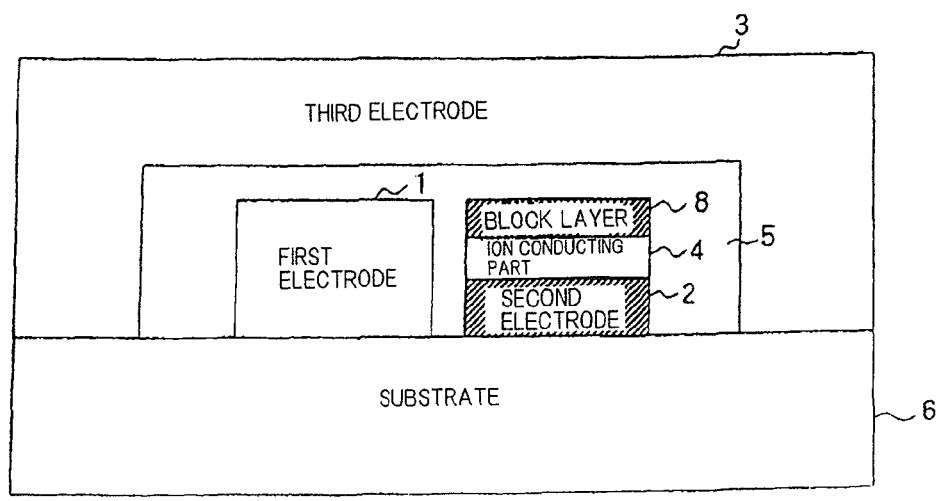
FIG. 10A is a schematic diagram illustrating a configuration of a seventh embodiment of a metal atom migration switching device having a gap and three terminals according to the present invention.
Figure 10B:
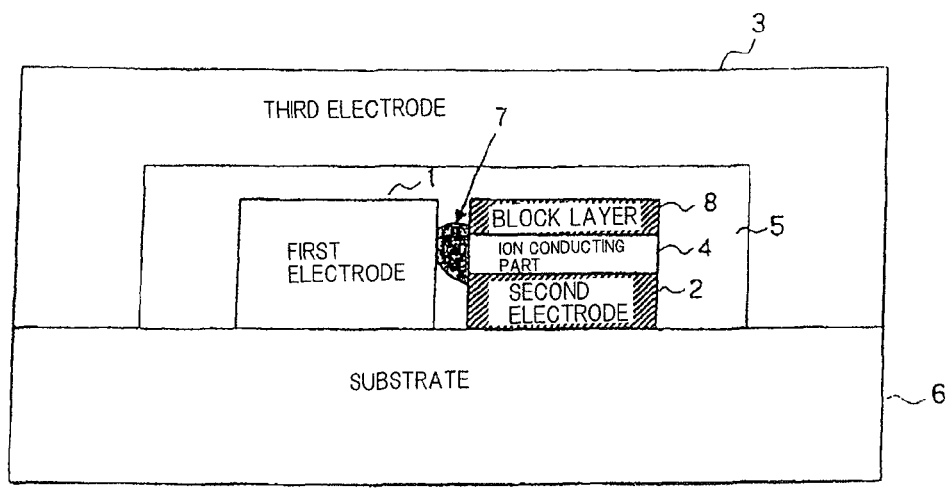
FIG. 10B is a schematic diagram illustrating growth of a precipitate for forming a metal wire between a first electrode and a second electrode shown in FIG. 10A.

FIG. 10A is a schematic diagram illustrating a configuration of a seventh embodiment of a metal atom migration switching device having a gap and three terminals according to the present invention. FIG. 10B is a schematic diagram illustrating growth of a precipitate for forming a metal wire between a first electrode and a second electrode shown in FIG. 10A.

As shown in FIG. 10A, the metal atom migration switching device of the seventh embodiment is different from the first embodiment in the point that ion conducting part 4 is formed on second electrode 2, and block layer 8 is formed on the surface of ion conducting part 4 on the side of third electrode 3. For block layer 8, dense, hard material such as SiO$_2$ is preferably used.

This difference generates the following difference in operation of the metal atom migration switching device. That is, because block layer 8 is formed of dense, hard material such as SiO$_2$, precipitate 7 will not grow inside of block layer 8. As a result, the growth direction of precipitate 7 is limited to the direction from ion conducting part 4 toward first electrode 1.

This may provide the advantage that wrong operation of the metal atom migration switching device (for example, an operation in which precipitate 7 extends in the direction toward third electrode 3 to be in contact with third electrode 3) can be prevented. Further, as described above, it is advantageous, when the drive method, in which a voltage relative to second electrode 2 is applied to third electrode 3, is adopted.

Further, in the metal atom migration switching device of the seventh embodiment, because ion conducting part 4 is laminated onto second electrode 2, as the size of the metal wire composed of precipitate 7 that grows in the direction from ion conducting part 4 toward first electrode 1 is increased, it comes into contact with second electrode 2 as shown in FIG. 10B.

The ion conductor of ion conducting part 4 has a smaller electric conductivity than that of metal. Therefore, connection between first electrode 1 and second electrode 2 through ion conducting part 4 has a larger on-resistance than that of a direct connection through the metal wire composed of precipitate 7 without ion conducting part 4. Reduction in the on-resistance is a very important advantage, because of the consideration that a reduction is specially required for a switching device in order to diversify functionality of the programmable logic and to promote implementation of it in electric appliances (see the section of BACKGROUND ART).

A method for manufacturing the metal atom migration switching device of the seventh embodiment is such that the order is reversed in which the step of forming second electrode 2 using liftoff method shown in FIG. 4B(f) and the step of forming ion conducting part 4 using liftoff method shown in FIG. 4A(e) are carried out, and the step of forming block layer 8 on ion conducting part 4 using liftoff method is added.

In addition, the metal atom migration switching device of the seventh embodiment, similarly to the second embodiment, may also include the insulator in gap 5. Further, the thickness of the region corresponding to the first gap between ion conducting part 4 and first electrode 1 in the first gap may be formed thinner than that of the other region including the second gap as shown in the fourth embodiment, and the insulator also may be configured to have a lower resistivity at the region between ion conducting part 4 and first electrode 1 that is lower than that at the other region as shown in the fifth embodiment.

Eighth Embodiment

Figure 11A:
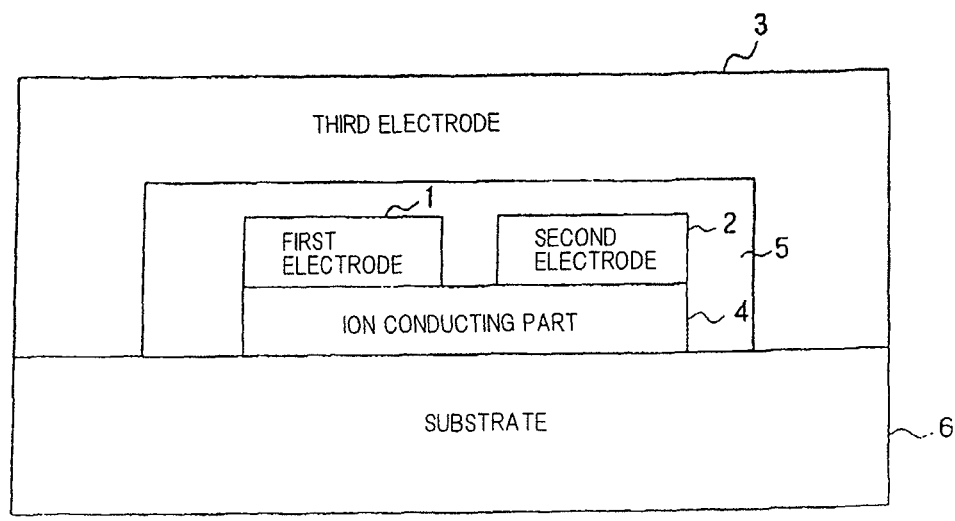
FIG. 11A is a schematic diagram illustrating a configuration of an eighth embodiment of a metal atom migration switching device having a gap and three terminals according to the present invention.
Figure 11B:
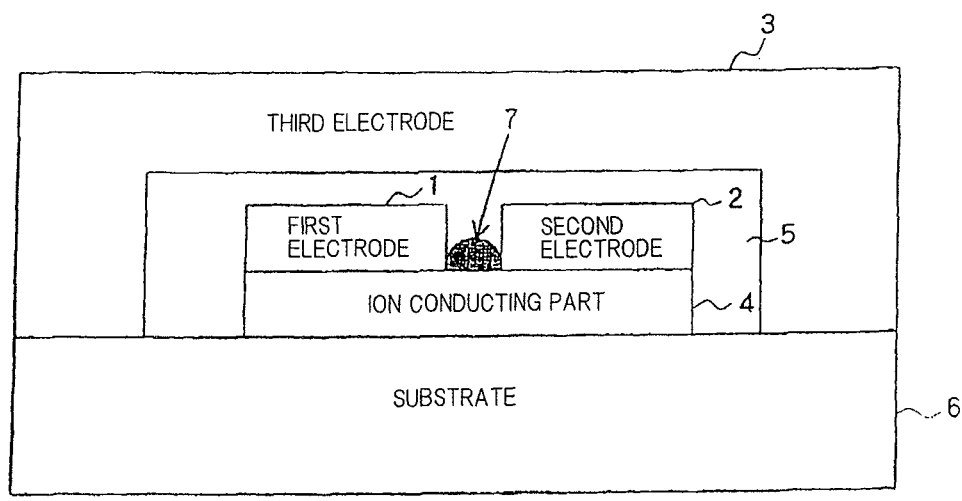
FIG. 11B is a schematic diagram illustrating growth of a precipitate for forming a metal wire between a first electrode and a second electrode shown in FIG. 11A.

FIG. 11A is a schematic diagram illustrating a configuration of an eighth embodiment of a metal atom migration switching device having a gap and three terminals according to the present invention. FIG. 11B is a schematic diagram illustrating growth of a precipitate for forming a metal wire between a first electrode and a second electrode shown in FIG. 11A.

As shown in FIG. 11A, the metal atom migration switching device of the eighth embodiment is configured in a manner such that ion conducting part 4 composed of an ion conductor (Cu$_2$S) is formed on insulating substrate 6 (SiO$_2$); and first electrode 1 (Pt) and second electrode 2 (Cu) for supplying metal ions (Cu+) to ion conducting part 4, or for receiving the metal ions (Cu+) from ion conducting part 4 to precipitate metal (Cu) that corresponds to the metal ions, are disposed on ion conducting part 4 at a predetermined distance away from each other.

Further, on substrate 6, third electrode 3 is formed so as to have gap 5 with ion conducting part 4. Gap 5 may be a vacuum, or filled with a gas. Alternatively, gap 5 may have an insulator. When gap 5 is the vacuum or is filled with the gas, it has a thickness of about 1 nm to about 10 nm. Further, when gap 5 has the insulator, it has a thickness of about 1 nm to about 100 nm. The thickness of ion conducting part 4 is about 10 nm to about 1,000 nm. First electrode 1 and second electrode 2 have a thickness of about 1 nm to 100 nm, respectively, and are positioned at a distance of about 1 nm to 100 nm away from each other.

The metal atom migration switching device of the eighth embodiment has a configuration basically different from the metal atom migration switching devices described in the first to seventh embodiments. That is, the metal atom migration switching devices of the first to seventh embodiments are configured in a manner such that the first gap is provided between ion conducting part 4 and first electrode 1, and ion conducting part 4 and first electrode 1 are not in contact with each other. On the one hand, the metal atom migration switching device of the eighth embodiment is configured in a manner such that ion conducting part 4 and first electrode 1 are in contact with each other.

Figure 1B:
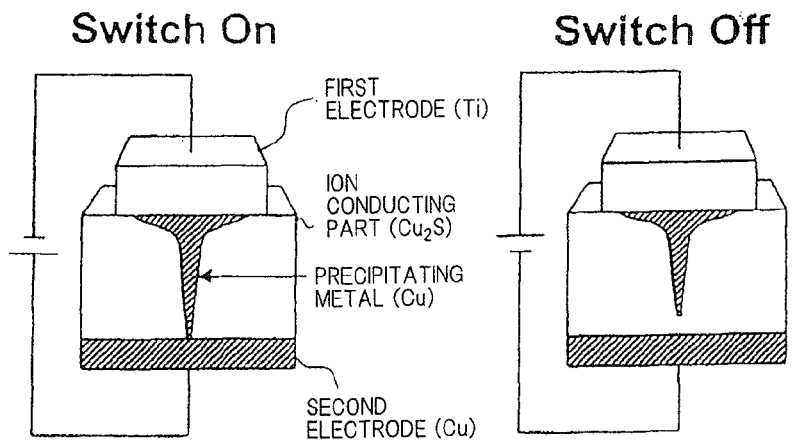
FIG. 1B is a schematic diagram illustrating a configuration and operation of a metal atom migration switching device without a gap and having two terminals.

As shown in FIG. 1B (see the section of BACKGROUND ART), if ion conducting part 4 is in contact with first electrode 1 and second electrode 2, it is believed that the metal atom migration switching device having a gap is formed and precipitate 7 grows inside ion conducting part 4.

However, in the metal atom migration switching device of the eighth embodiment, since first electrode 1 and second electrode 2 are formed at a predetermined distance away from each other on ion conducting part 4, precipitate 7 will be precipitated at a region between first electrode 1 and second electrode on a surface of ion conducting part 4.

If precipitate 7 is precipitated in this way on the surface of ion conducting part 4 between first electrode 1 and second electrode 2, when a negative voltage relative to second electrode 2 is applied to third electrode 3, electrons, which will reduce the metal ions in the ion conductor (tunneling electrons, electrons thermally excited in the insulator, and electrons created from impurities and defects), reach the surface of ion conducting part 4 to contribute to an increase in the size of the metal wire composed of precipitate 7.

That is, in the metal atom migration switching device of the eighth embodiment, ion conducting part 4 is in contact with first electrode 1 and second electrode 2, but the metal atom migration switching device of the eighth embodiment is substantially the metal atom migration switching device having a gap and three terminals, similarly to the metal atom migration switching devices shown in the first to seventh embodiments.

In the metal atom migration switching device of the eighth embodiment, precipitate 7 grows only at a region between first electrode 1 and second electrode 2 on the surface of ion conducting part 4 (see FIG. 11B).

Therefore, there is provided the advantage that wrong operation of the metal atom migration switching device (for example, an operation that precipitate 7 extends in the direction toward third electrode 3 to be in contact with third electrode 3) can be prevented. Further, as described above, it is advantageous, when the drive method, in which a voltage relative to second electrode 2 is applied to third electrode 3, is adopted.

Further, in the eighth embodiment, first electrode 1 and second electrode 2 are connected to each other without ion conducting part 4. The ion conductor of ion conducting part 4 has a smaller electric conductivity than that of metal. Therefore, the connection between first electrode 1 and second electrode 2 through ion conducting part 4 has a larger on-resistance than that of a direct connection with the metal wire composed of precipitate 7 without ion conducting part 4.

Reduction in the on-resistance is a very important advantage, because of the consideration that a reduction is strongly required for a switching device in order to diversify functionality of the programmable logic and to promote implementation of it in electric appliances (see the section of BACKGROUND ART).

The metal atom migration switching devices shown in the first to eighth embodiments can apply to the following apparatus or circuit.

For example, usage of the metal atom migration switching devices according to the present invention as a programming device can provide a programmable integrated circuit device (programmable logic).

Further, a memory device can also be provided by using the metal atom migration switching device according to the present invention and a transistor for detecting whether the metal atom migration switching device is in an on state or in an off state is provided.

The invention claimed is:

1. A switching device, comprising:
an ion conducting part having an ion conductor inside of which metal ions can move, a first electrode formed on said ion conducting part to be in contact with said ion conducting part, a second electrode positioned on said ion conducting part at a predetermined distance away from said first electrode, for supplying said metal ions to said ion conductor, or for receiving said metal ions from the ion conductor to precipitate metal corresponding to the metal ions, and formed to be in contact with the ion conducting part, and a third electrode formed to have a gap with the ion conducting part, wherein:
when a negative voltage relative to said second electrode is applied to said third electrode, a precipitate composed of said metal grows at a region of said ion conducting part between said first electrode and said second electrode, and in response to growth of the precipitate, electric characteristics change, and
wherein the amount of precipitate is controlled by applying a voltage to said third electrode from the outside.

2. The switching device according to claim 1, wherein:
said change of electric characteristics is a change in a state of conduction or non conduction between said first electrode and said second electrode.

3. The switching device according to claim 1, wherein:
said predetermined distance is 1 nm to 100 nm.

4. The switching device according to claim 1, wherein:
said ion conductor includes $Cu_2S$, a compound of a chalcogen element and metal, an insulator including silicon, or a perovskite oxide.

5. The switching device according to claim 1, wherein:
said metal includes Cu, Ag or Pb.

6. The switching device according to claim 1, wherein:
said first electrode and said third electrode include Pt, metal having a high-melting point or silicide.

7. An integrated circuit device using the switching device according to claim 1 as a programming device.

8. A memory device, comprising:
the switching device according to claim 1, and a transistor for detecting whether said switching device is in a conduction state or in a non conduction state.

* * * * *